United States Patent
Smith et al.

(10) Patent No.: US 6,344,281 B1
(45) Date of Patent: Feb. 5, 2002

(54) ALUMINUM METALLIZATION METHOD AND PRODUCT

(75) Inventors: Mark Smith, Lakeville; Ivan Ivanov, Burnsville, both of MN (US); Frederick Eisenmann, Hudson, WI (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 09/421,333

(22) Filed: Oct. 18, 1999

(51) Int. Cl.[7] .................... B32B 15/00; B05D 5/12
(52) U.S. Cl. .................... 428/651; 427/99; 427/124; 428/627; 428/641; 428/650; 428/938; 438/648; 438/656; 438/660; 438/678; 438/685; 438/688
(58) Field of Search .................... 428/651, 650, 428/641, 627, 938, 546; 427/99, 124; 438/648, 656, 660, 678, 685, 688

(56) References Cited

U.S. PATENT DOCUMENTS

| | | | | |
|---|---|---|---|---|
| 3,848,330 A | * | 11/1974 | Hall et al. | 438/660 |
| 5,071,714 A | * | 12/1991 | Rodbell et al. | 428/651 |
| 6,156,645 A | * | 12/2000 | Geha et al. | 438/648 |

* cited by examiner

Primary Examiner—Robert R. Koehler
(74) Attorney, Agent, or Firm—Piper Marbury Rudnick & Wolfe, LLP; Steven B. Kelber

(57) ABSTRACT

IC fabrication employs the deposition of aluminum as a metallization layer. Frequently, the aluminum is doped with copper in small amounts to improve electric properties. Low temperature deposition of these layers is preferred to ensure the proper microstructure and surface roughness. Low temperature deposition (below about 300° C.) results in the formation of copper precipitates which can be difficult to remove. Annealing the layer formed, either prior to, or after formation of capping layers and additional layers thereon, drives the copper precipitate back into solution, permitting small dimension fabrication.

20 Claims, 2 Drawing Sheets

Standard Process

New Process

ALUMINUM METALLIZATION METHOD AND PRODUCT

BACKGROUND OF THE INVENTION

1. Field of the Invention

This invention pertains to an improved method of depositing aluminum films, and specifically, for suppressing the formation of copper precipitates in aluminum films formed from aluminum comprising small amounts of copper as a deliberately included impurity. The invention finds specific application in the field of integrated circuits and similar small dimension fabricated devices.

2. Background of the Prior Art

Metallization is a process for forming a uniform metal layer on a substrate surface, so as to take advantage of the presence of that metal layer in subsequent fabrication techniques. As applied to integrated circuit (IC) technology, metallization has come to refer to the formation of uniform layers of conductive material over a dielectric or insulating layer, or directly on a substrate. These metallizing layers provide for continuous electrical connection within an array layer, and conductivity between layers through "vias", access holes penetrating through conductive and insulating layers to active regions, filled with conductive material.

The most popular metal selected for metallization in IC fabrication is aluminum. Thus, most integrated circuits begin with selection of a substrate, the formation of a dielectric, insulating layer there over, and then deposition of a metal layer, or metallization, comprised of aluminum. Aluminum is an excellent conductor, having approximately 62% of the conductivity of copper. To further improve the conductivity of aluminum and improve electromigration properties in the layer, the aluminum may be "doped" or provided with a small amount of copper deliberately included as an impurity. Thereafter, a photoresist or other masking device is provided on the aluminum, and the first layer structure of the ultimate device is typically formed by etching in areas covered or uncovered by the photoresist development. Aluminum is a particularly preferred metallizing compound for a variety of reasons. Aluminum is typically deposited by physical vapor deposition (generally, through sputter deposition). Aluminum deposition at low temperatures, below about 300° C., permits the formation of the correct aluminum microstructure, proper surface roughness, and other desirable physical-chemical properties.

In many embodiments, a wetting layer is inserted between the dielectric and the aluminum, to further improve adherence, and in particular, to ensure a uniform thickness of deposition. Exemplary wetting layers include titanium, tantalum and tantalum and titanium alloys. Tungsten has also been proposed as a metallization target and yields better uniformity of thickness when the surface being metallized has a non-flat topography. For this reason, many wetting layers are comprised of titanium/tungsten mixtures, or a TiW alloy. After the wetting layer is deposited, metallization proceeds. The wetting layer is typically much thinner than the metallization layer.

While the incorporation of copper into the aluminum metallization layer provides significant advantages in performance, low temperature aluminum deposition results in the formation of copper precipitates. These present a particular problem in IC fabrication processes, because copper precipitates frequently reach sizes of 0.1–0.5 micron, and are difficult to remove from the aluminum layer. Yet, these imperfections, if located in an area to be processed (i.e., an area to receive a feature through etching) may prevent uniform formation, interconnection, and may ultimately result in a loss of the chip. Conventional methods for removing copper pecipitates from aluminum layers are limited. The removal of copper precipitates may be effected by combining a high intensity ion bombardment with an aggressive plasma etching step. These conventional techniques, however, make it difficult to form small size features, that is, to etch and define features with very small resolution. In order to withstand these conditions, a much thicker photoresist layer is required, which itself in turn, limits the minimum resolution and size of the features to be etched. Thus, the formation of copper precipitates in copper-doped aluminum sets a process and size limitation on cold metallization formation, which is desirable from all other aspects. Those of skill in the art continue to search for a way to employ cold aluminum deposition in copper-doped aluminum, for the fabrication of IC and other small-dimensioned products, without being limited to features in excess of a certain critical size, generally about 0.3–0.4 microns.

SUMMARY OF THE INVENTION

The invention addressed herein achieves the objects described above, and other specific and valuable objects as detailed herein below. Specifically, the invention provides for a method of metallization using copper-doped aluminum, which prevents the formation of larger copper precipitates. By forcing copper back into solution, thinner photoresist films can be used, which in turn permits the formation of features of smaller dimension. Accordingly, copper precipitation is avoided as a size-limiting process feature.

The metallization process of the invention employs conventional process steps in the preparation of a substrate, dielectric layer if necessary, wetting layer if necessary and cold deposition of copper-doped aluminum. After formation of the aluminum layer, or other processing of the aluminum, the substrate bearing the aluminum layer is annealed at temperatures which force the copper in the aluminum back into solution, temperatures above about 300° C. Specifically, in a preferred embodiment, the aluminum metallization layer is heated to its plastic deformation temperature. By holding the metallized substrate at a temperature, and for a time (typically less than a minute), sufficient to force copper precipitates formed in the deposition process back into solution, defects are avoided, yield is increased and higher resolution of small features, with relatively narrow photoresists, is achieved.

DETAILED DESCRIPTION OF THE INVENTION

Figure 1:
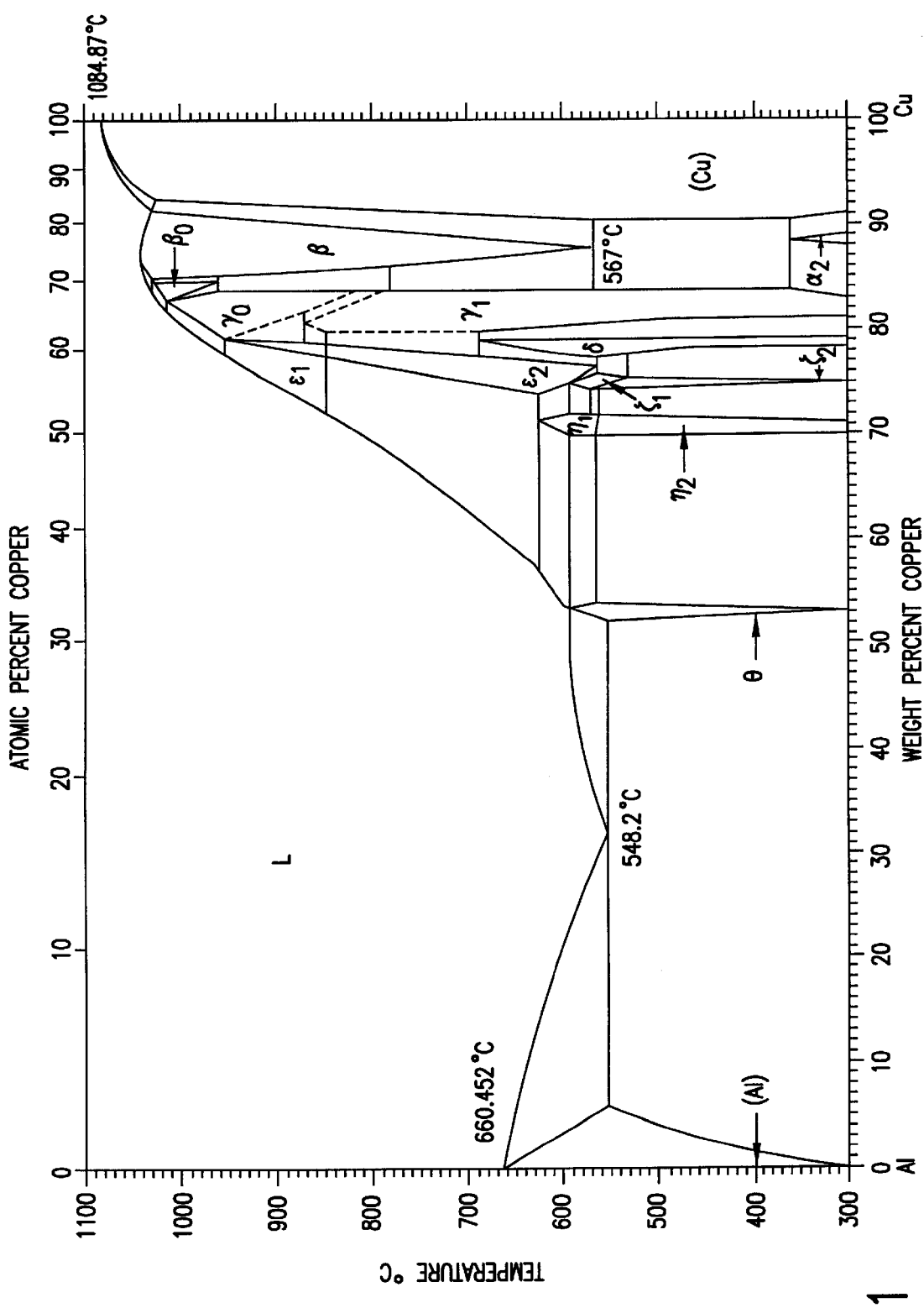
FIG. 1 is a Graphical illustration of the relationship between copper wt % and solution point in an aluminum layer.

The invention is described herein, generically and by reference to specific embodiments. Aspects of the invention, including the provision of an adequate substrate, etching processes, etc., are conventional of those of skill in the art, and unless they form an aspect of the invention, per se, will not be described in detail. For a general teaching on IC formation and processing, reference may be had to 14

Kirk-Othmer Encyclopedia of Chemical Technology, page 677, et. seq. (Wiley 1995). IC fabrication begins with a substrate. Typically the substrate is a silicon wafer, although other substrates, including gallium-based substrates, such as gallium arsenide substrates are known. GaAs substrates have specific applications, particularly involving cellular communications. Other substrates have been developed for specific applications, and can be used in accordance with the inventive process, to the extent they require aluminum metallization.

The substrate may be provided with a dielectric layer, typically silicon dioxide. Again, a wide variety of dielectrics are known, and insulating effects can also be provided by silicon oxynitrides, nitrides, and a wide variety of other dielectric materials. This invention is not limited to any of these dielectrics, nor is it limited to the provision of a dielectric over the surface of the substrate itself.

Typically, following formation of the substrate and/or insulating layer, the exposed surface on which the IC is to be built is subjected to an etching procedure, to clean, or "pre-clean" the wafer. This removes both impurities, and gross irregularities in the substrate surface. The most common form of pre-cleaning employs sputter etching of the wafer itself, although other etching processes, and cleaning processes, are known to those of ordinary skill in the art. Again, the parameters of any particular wafer sputter etching process are conventional to those of skill in the art, and are not addressed herein with particularity, as they do not constitute an aspect of the invention, per se.

This invention can be employed without the use of a wetting layer. Many IC fabrication processes require a wetting layer, however, to improve the adherence and formation of an aluminum layer on the substrate. The pre-cleaned substrate is subjected to the deposition of a wetting layer through a physical or chemical vapor deposition process, typically using a titanium target, or titanium alloy. As noted above, other wetting layers, including tungsten layers are known. Alternate wetting layer materials include TiN and tantalum and tantalum compounds such as TaN. Chromium and chromium alloys may also be used for the wetting layer. A combination of these may also be used. Preferably, the wetting layer is a TiW alloy. The thickness of wetting layers will vary dramatically with respect to the ultimate function of the IC, but conventionally, wetting layers range from about 100–1,000 Å. A preferred range is 400 to 600 Å thickness. The wetting layer may be deposited through any of a variety of conventional processes. It may be a one or two step process, including the formation of the wetting layer at relatively high temperatures greater than about 270° C. Such process are disclosed in detail in commonly owned U.S. patent application Ser. No. 08/740,290, now U.S. Pat. No. 6,156,645, and the same is incorporated herein by reference in its entirety. In the alternative, the wetting layer may be dispensed with entirely.

After formation of the wetting layer, the substrate is cooled (if the temperature of wetting layer formation was elevated) and an aluminum/copper film is formed in the metallization process. The incorporation of copper in small amounts in aluminum to improve performance is well known to those of skill in the art. Typically, copper concentrations range up to 0.5%, although they may be higher. Concentrations from trace amounts, up to and including 2.0% by weight may be employed in this process. As with the foregoing process steps, the cold deposition of aluminum, at temperatures below about 300° C., is customary in the art, and permits the formation of the correct microstructure and surface roughness. This invention takes advantage of low temperature aluminum deposition. The invention is more broadly applicable to the deposition of aluminum at temperatures below the solution point of the copper precipitates, that is, below about 430° C. at 2.0 Wt % Cu. At 0.5 wt % Cu the solution point is about 330° C. The specific temperature will vary from actual copper concentrations. The relationship between solution point and copper percentage is graphically illustrated in FIG. 1. The problems encountered in the formation of copper precipitates are particularly aggravated in the case of very low temperature deposition below about 300° C. Copper precipitates are comprised of θ phase $Al_2Cu$. These materials are at least meta-stable. The thickness of the aluminum layer may range from 1,000–10,000 Å, with a preferred range being 4,000–7,500. Process conditions are conventional, and as in the previous formation layers, argon gas is typically used, although argon/hydrogen mixtures, and other non-reactive gases are known to those of skill in the art.

Following the low temperature deposition, the IC substrate bearing the aluminum/copper low temperature deposition layer is subjected to an annealing step. The temperature and time of annealing is controlled so as to force copper back into solution. Clearly, the greater the amount of copper, the higher temperature and/or longer time may be required. A minimum temperature is about 300–330° C. with temperatures of about 430–450° C. and above being preferred. Temperatures of 480° C. and more constitute a particularly preferred class of conditions. There is no maximum temperature, provided the temperature is maintained below the melting point of the substrate and formed layers, as well as the maximum operating temperature of the apparatus in extreme cases. A conventional heater for PVD processes is the Endura™ HTHU (High Temperature High Uniformity) heater, in which it is conventional to maintain a chamber at 480° C., and this is acceptable in the claimed process. Above about 500° C., properties of the IC to be fabricated may be affected, such as threshold voltages and the like. Accordingly, it is preferable to maintain a temperature below about 500° C. held for no more than 20 minutes. At 480° C., the annealing step at 6,000 Å metallization layer is about 45 seconds or less. A minimum anneal time is about 3 seconds. A period of time of at least 20 seconds may be used. In general, the annealing step ranges from approximately 300–660° C., for a period of time running from approximately 30 seconds–1 minute. While it is within the scope of the invention to exceed these extremes, they are not seen as fully necessary. In a preferred embodiment, the gaseous environment for the anneal step comprises argon gas (or another inert gas or gas mixture) or an argon/hydrogen mixture.

On cooling from annealing, according to a conventional quench and cool, the metallization process is effectively complete, and an aluminum layer has been deposited without the formation of copper precipitates with an average diameter in excess of 1,000 Å. The formation of extremly small copper precipitates below this size does not constitute an obstacle to current IC fabrication. The formation of these ultra small precipitates is controlled to a great degree by the speed and nature of the quenching. Quenching at extremely high speeds (e.g., using liquid nitrogen) may suppress copper precipitate formation altogether.

In many fabrication processes, it is desirable to provide a cap layer on top of the metallization layer. The cap layer is provided for electromigration within the layers, and to protect the aluminum layer. The same is practicable with the invention herein, and a capping layer similar to that described above for a wetting layer may be employed. In a preferred embodiment, the cap layer deposited on the surface of the aluminum metallization layer is thinner, preferably from 100–500 Å. The same metal and metal alloy layers used for the wetting layer are preferred, with TiW constituting one aspect of the preferred embodiment. In the alternative, tungsten may be employed as the over deposited capping layer.

In a preferred embodiment, the metallization layer is annealed at or above its plastic deformation temperature. At these temperatures, ordinary obstacles to migration presented by grain boundaries are reduced, improving the suppression of copper precipitates. As shown in FIG. 1, this temperature will vary with percentage of copper.

EXAMPLES

In order to compare the effects of modulating different aspects of the IC fabrication process described, seven different processes were used to generate partially fabricated IC wafers.

In Example 1, the prepared substrate was subjected to a 50 Å etch, followed by deposition of a 500 Å titanium tungsten wetting layer, a 6,000 Å aluminum layer deposited at 200° C. comprising 0.5%, by weight, copper, which was subjected to quenching (40 seconds at 40° C. with 5,000 mT backside pressure & 20 sccm Ar) followed by a 300 Å TiW capping layer deposition.

In Example 2, the process of Example 1 was replicated, except the quench of Example 1 was substituted with a 30 second hold in the deposition process position under deposition temperature and gas conditions.

In Example 3, the process of Example 2 was followed, but a rapid cooling step was inserted between the 30 second wait under deposition conditions and formation of the overlying cap layer.

In Example 4, the process of Example 1 was followed, however, after formation of the 300 Å overlying capping layer, the partially fabricated substrate was held for 45 seconds at 480° C. with 20 sccm argon. This was followed by a rapid quench and cool down conventional in the industry.

In Example 5, the process of Example 4 was followed, but the quenching step was omitted.

In Example 6, the same processing steps of a 50 Å etch, followed by a 500 Å TiW wetting layer, a 6,000 Å aluminum/0.5% copper layer and a 300 Å TiW capping layer as used in Example 5 was followed. Formation of the capping layer was followed by the annealing step at 480° C. and then holding the partially fabricated IC for 40 seconds in the conditions of aluminum deposition of 200° C., followed by a cool-down.

In Example 7, the process of Example 3 was followed without the quenching step.

RESULTS

Figure 2:
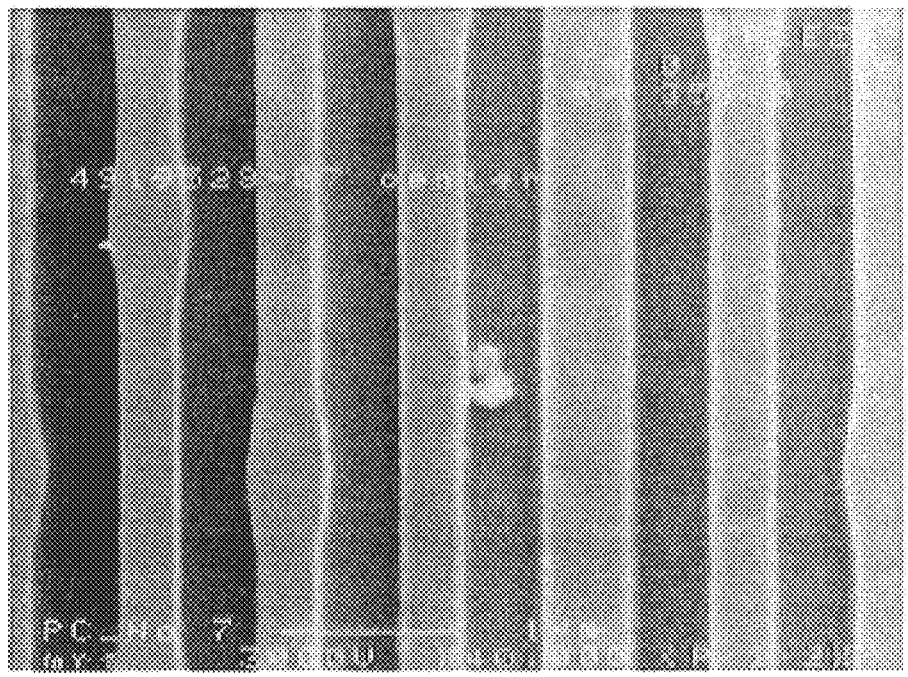
FIG. 2 is a SEM photomicrograph of an actual shape processed according to the invention showing an absence of copper precipitates in the patterned area.
Figure 2:
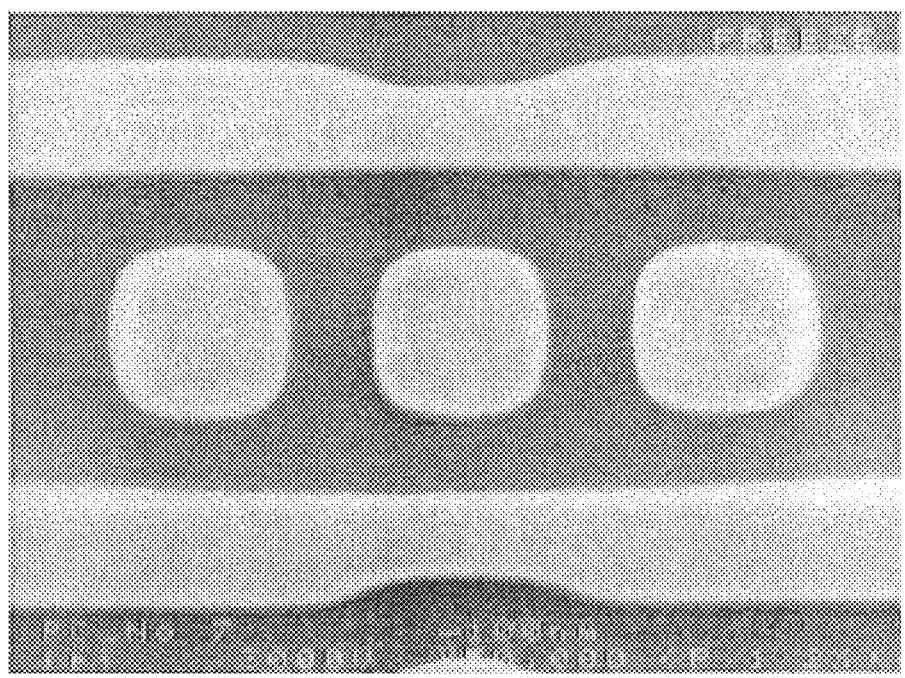

The partial fabricated IC of Examples 1–7 were inspected by scanning electron microscope (JOEL inspection). Of the examples tested, only Examples 4, 5 and 6, each of which employed an annealing step at or above about 430° C. showed a complete absence of metal spires due to copper precipitates in excess of about 1,000 Å average diameter in the metallization layer. In SEM photomicrographs of actual metallization areas formed by this melted, no copper precipitates were detected in pattern forming areas. See FIG. 2.

The metallization layer may be annealed either before or after formation of the overlaying capping layer (the layer opposite the layer between the aluminum and the etched substrate/dielectric surface). This invention is particularly desirable because it permits use of conventional IC fabrication equipment and processing controls, without substantial capital investment. As noted, conventional heaters are easily capable of meeting and holding the necessary anneal conditions, This invention may be practiced using a single deposition chamber which is configured for each related step, a multi-chamber deposition apparatus, or a series of separate chambers, to which the IC "in-fabrication" is shuttled. This invention is consistent with any processing conditions that comprise the formation of a layer of aluminum comprising small amounts of copper, at low temperatures resulting in the potential formation of copper precipitates, followed by an annealing step which drives the copper back into solution.

This invention has been described in generic terms, and by reference to specific example. The examples are not intended to be, and should not be construed as, limiting, as alternatives will occur to those of ordinary skill in the art without the exercise of inventive faculty. In particular, alternative specific conditions for deposition, thicknesses, materials and the like will occur to those of ordinary skill, and remain within the scope of the invention, unless expressly excluded by the claim recitations set forth below.

What is claimed is:

1. A process for forming a thin layer of aluminum comprising copper on a substrate, wherein said layer is formed at temperatures under 300° C., and said process further comprises annealing said layer of aluminum comprising copper at a temperature and time sufficient to force any copper precipitates formed in said deposition process into solution.

2. The process of claim 1, wherein said step of annealing said aluminum is conducted at a temperature of at least 300° C., for a period of at least 20 seconds.

3. The process of claim 1, wherein said aluminum comprises up to 2.0% copper (by weight).

4. The process of claim 1, wherein said layer comprises from a trace amount of copper up to 0.5% by weight.

5. A method of fabricating an integrated circuit, comprising forming on a surface of a substrate, a layer comprised of aluminum and copper, wherein said layer of aluminum and copper is formed at a temperature below about 300° C., and subsequently annealing said substrate bearing said layer at a time and temperature sufficient to force copper in said layer into solution.

6. The process of claim 5, wherein said step of annealing comprises heating said substrate with said layer formed thereon at a temperature of at least the plastic deformation temperature of said layer of aluminum and copper for a period of at least 3 seconds.

7. The method of claim 6, wherein said step of annealing is conducted for a time of at least 20 seconds.

8. The method of claim 5, wherein said annealing step is conducted for a period of time of at least 45 seconds.

9. The process of claim 5, wherein said substrate surface is prepared by sputter etching prior deposition of said aluminum and copper.

10. The process of claim 9, wherein a wetting layer is deposited after said sputter etching and prior to deposition of said layer of aluminum and copper.

11. The method of claim 10, wherein said wetting layer is comprised of titanium, titanium alloy, titanium nitride, tantalum, tantulum alloy, tantatulum nitride, chromium or chromium alloys.

12. The method of claim 10, wherein said wetting layer is comprised of titanium and tungsten.

13. The process of claim 5, wherein subsequent to formation of said layer of aluminum and copper, a capping layer is formed over an exposed surface of said layer of aluminum and copper.

14. The method of claim 13 wherein said capping layer is comprised of titanium, titanium alloy, titanium nitride, tantalum, tantalum alloy tantalum nitride, chromium or chromium alloy.

15. The method of claim 13, wherein said capping layer is deposited prior to said annealing step.

16. The method of claim 13, wherein said capping layer is deposited after said annealing step.

17. An article of manufacture, comprising a substrate having at least one layer, a layer of aluminum further comprising copper deposited over said layer of said substrate, wherein said layer of aluminum comprising copper has been formed by deposition at temperatures below about 300° C., and wherein said layer of aluminum comprising copper is substantially free of copper precipitates in excess of 1,000 Å in average diameter.

18. The article of manufacture of claim 17, wherein said article further comprises a wetting layer between said substrate layer and said layer of aluminum comprising copper.

19. The article of manufacture of claim 18, wherein said wetting layer comprises titanium, a titanium alloy, titanium nitride, tantalum, a tantalum alloy, tantalum nitride, chromium or chromium alloy.

20. The article of manufacture of claim 17, wherein said article of manufacture comprised of a layer of aluminum comprising copper further comprises a capping layer comprising titanium, a titanium alloy, titantium nitride, tantalum, a tantalum alloy, tantalum nitride, chromium or chromium alloy formed thereon.

* * * * *